United States Patent [19]
Johnson et al.

[11] Patent Number: 5,636,996
[45] Date of Patent: Jun. 10, 1997

[54] ANISOTROPIC INTERPOSER PAD

[75] Inventors: David C. Johnson, Winston-Salem; Keith L. Volz, Jamestown; Warren A. Bates, Winston-Salem; Frederick R. Deak, Kernersville; Charles P. Brooks, Winston-Salem, all of N.C.

[73] Assignee: The Whitaker Corporation, Wilmington, Del.

[21] Appl. No.: 600,559

[22] Filed: Feb. 12, 1996

Related U.S. Application Data

[63] Continuation of Ser. No. 266,922, Jun. 28, 1994, abandoned.

[51] Int. Cl.$^6$ ................................................ H01R 9/09
[52] U.S. Cl. ........................................ 439/66; 439/91
[58] Field of Search ........................... 439/66, 91, 591; 228/180.21, 180.22

[56] References Cited

U.S. PATENT DOCUMENTS

| | | | |
|---|---|---|---|
| 3,320,658 | 5/1967 | Bolda et al. | 228/180.22 |
| 3,541,222 | 11/1970 | Parks et al. | 439/66 |
| 3,967,162 | 6/1976 | Ceresa et al. | 439/66 |
| 4,664,309 | 5/1987 | Allen et al. | 228/175 |
| 4,737,112 | 4/1988 | Jin et al. | 439/66 |

Primary Examiner—Neil Abrams

[57] ABSTRACT

An anisotropic interposer pad (10) disposed between a first surface (11) and a second surface (12) in an electrical interface wherein the interface surfaces (11, 12) are non-compatible metals. The interposer pad (10) is a plastic layer (20) and a plurality of spaced-apart electrically conducting particles (21) are disposed in a random pattern throughout the plastic layer (20). The particles (21) extend between the first side (22) of the plastic layer (20) and the second side (23) of the plastic layer (20). There is no lateral contact between any of the particles (21). The particles (21) are electrically conductive in a direction oriented between the first side (22) and the second side (23) of the plastic layer (20). The particles (21) act as an electrical connection between the first surface (11) and the second surface (12).

7 Claims, 2 Drawing Sheets

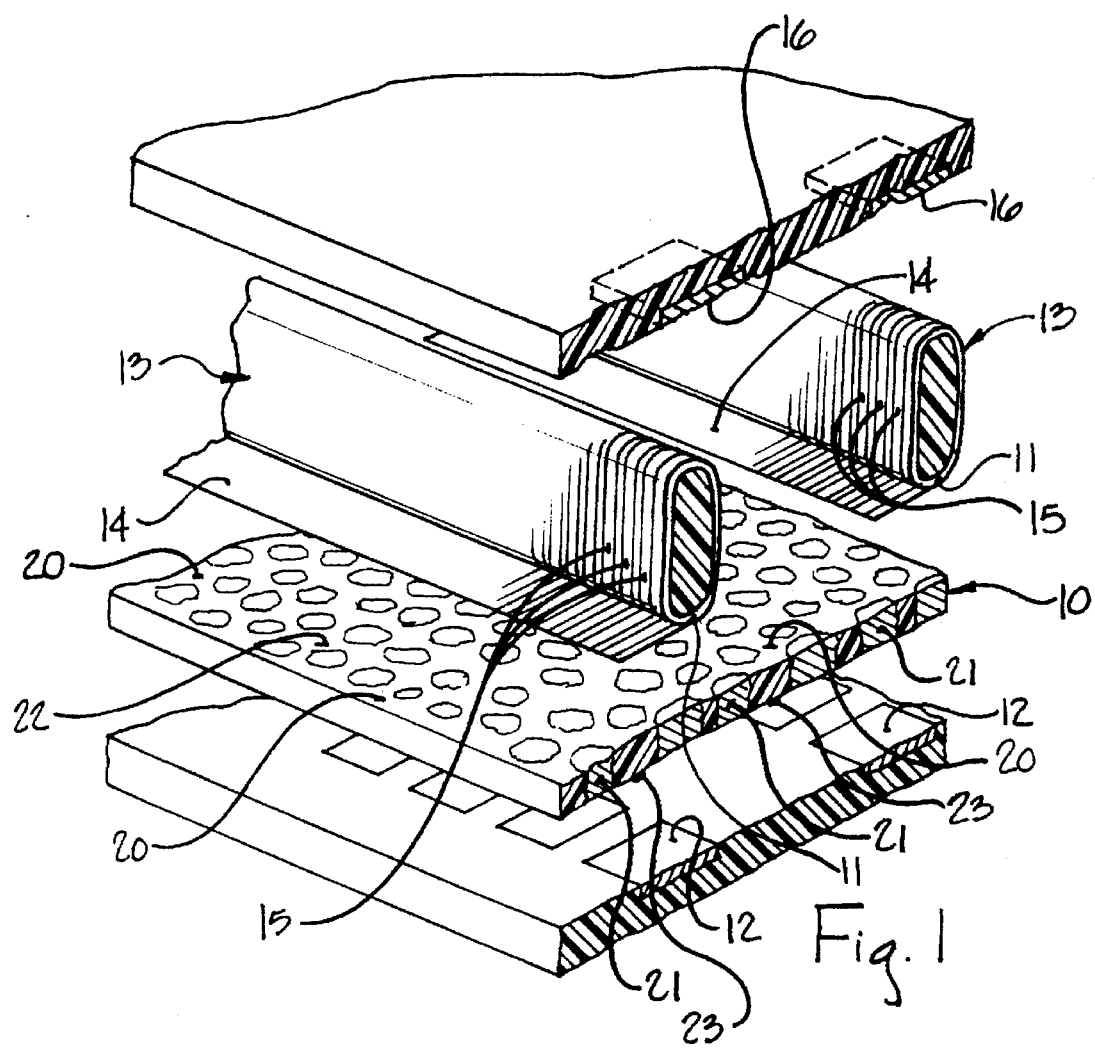
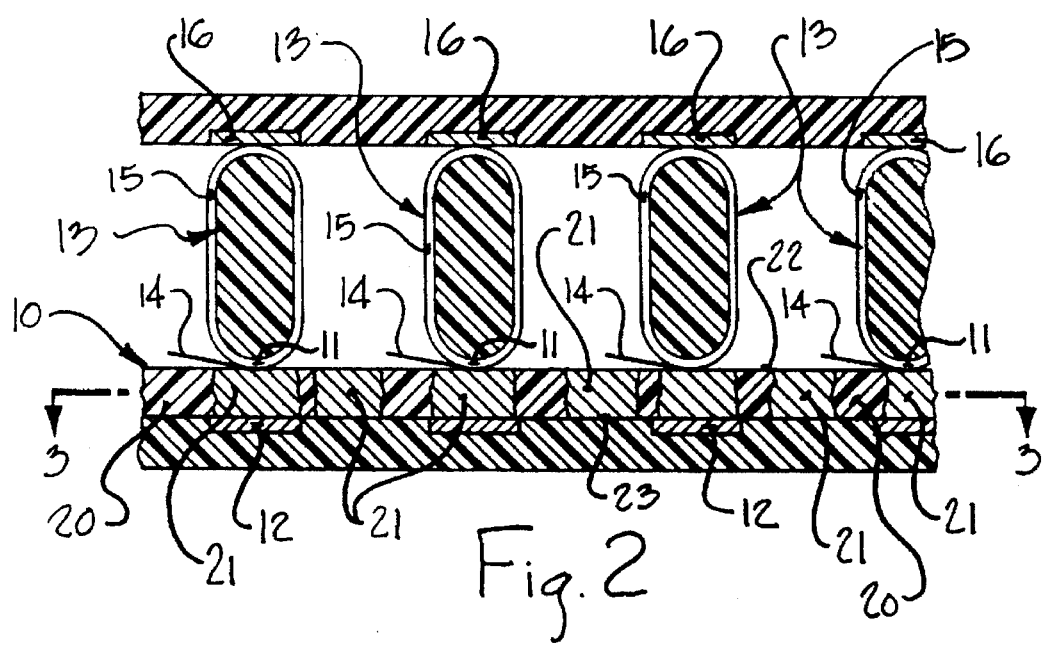

ANISOTROPIC INTERPOSER PAD

This application is a continuation of application Ser. No. 08/266,922 filed Jun. 28, 1994, now abandoned.

The present invention relates to an electrical connection between surfaces, and more particularly to a plastic layer having conducting particles disposed therein in which the particles form a direction oriented connection between the surfaces.

BACKGROUND OF THE INVENTION

In electrical interfaces, the contact surfaces are frequently made of metals or metal platings which are non-compatible. This non-compatibility is usually due to oxidation of one or more of the contact surfaces. As an example, the contacts may be made of silver, copper, tin or alloys of these metals. Due to exposure to the atmosphere, and especially under conditions of elevated temperatures which can be produced in electrical equipment, the surfaces of the metals oxidize. The oxidized metal surfaces are comparatively poor electrical conductors and a satisfactory electrical circuit is not obtained in the connector. One solution to this problem is to use noble metal platings, such as gold, on the contacting surfaces. However, the use of gold, even as an extremely thin plating, becomes cost prohibitive.

A further complication arising in an electrical contact between surfaces of differing metals or metal platings, is the difference in the differential movement of the surfaces by such as can be caused by thermal expansion of the dissimilar metals surfaces. Although a satisfactory contact may be effected at a given temperature when the temperature increases or decreases, the difference in thermal expansion between the metals results in a disparity between the dissimilar metals which causes an unsatisfactory electrical contact.

Thus, there is a need for an inexpensive, reliable electrical connector between contacting surfaces of metals which form oxides and also between dissimilar metals which have differing coefficients of thermal expansion.

SUMMARY OF THE INVENTION

The present invention provides a pad which may be interposed between contacting surfaces to provide a reliable and comparatively inexpensive interface between contacting surfaces.

In accordance with the teachings of the present invention there is disclosed herein an anisotropic interposer pad disposed between a first surface and a second surface in an electrical connector. The respective surfaces are non-compatible metals. The interposer pad includes a plastic layer having a first side in contact with the first surface and a second side in contact with the second surface. A plurality of electrically conducting particles are disposed in a random pattern throughout the plastic layer between the first side and the second side of the plastic layer. There is no lateral contact between any of the particles. The electrical conductive particles in the plastic layer electrically conduct in a direction oriented between the first side of the plastic layer and the second side of the plastic layer. In this manner, the first surface and the second surface of the electrical interface are connected to form a reliable electrical transition between the non-compatible surfaces and thereby increase interconnection density.

These and other objects of the present invention will become apparent from a reading of the following specification, taken in conjunction with the enclosed drawings.

BRIEF DESCRIPTION OF THE DRAWINGS

FIG. 1 is an exploded perspective view of the present invention, diagrammatically showing a first surface which is disposed on a compressible core and a second surface with the interposer pad between the surfaces.

FIG. 2 is a cross-sectional view of FIG. 1 showing the interposer pad disposed between the first surface and the second surface.

DETAILED DESCRIPTION OF THE PREFERRED EMBODIMENTS

Figure 3:
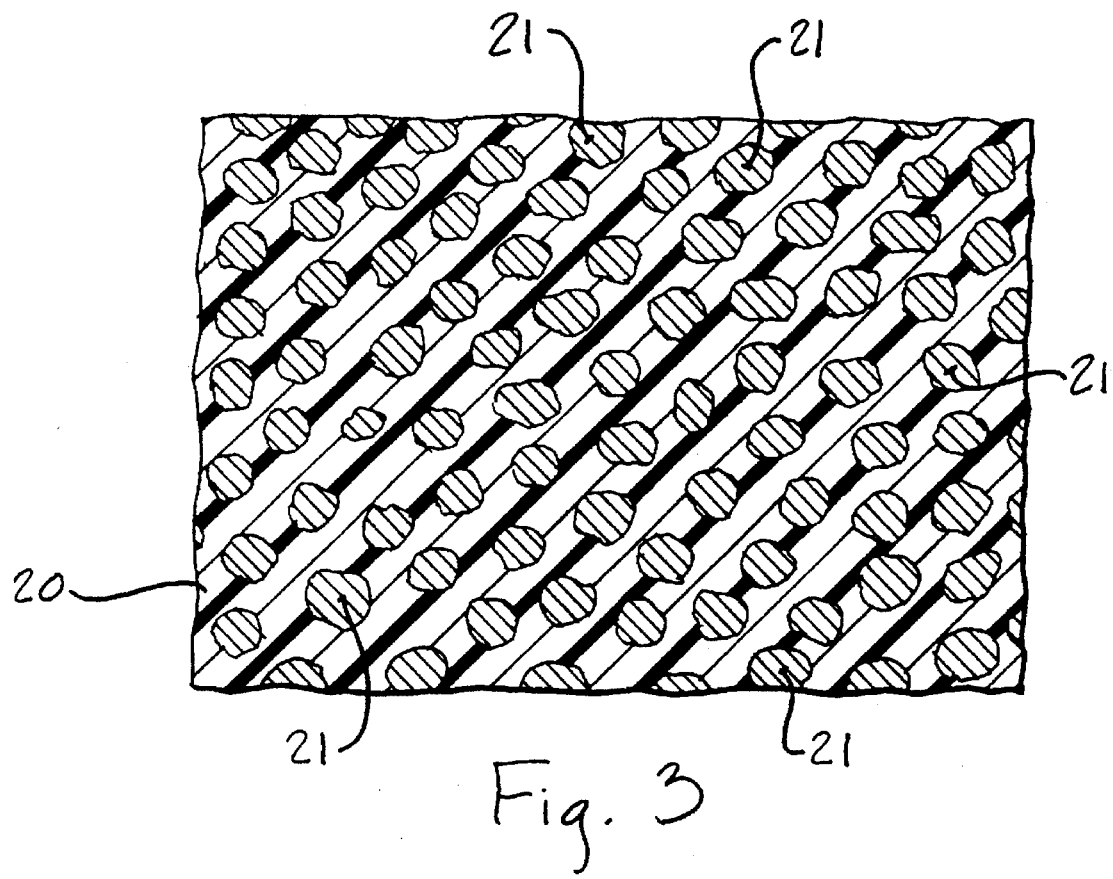
FIG. 3 is a cross-sectional view taken across the lines 3—3 of FIG. 2.

The invention is directed to an electrical interface between conducting surfaces within a connector, where the connector may be used with printed circuit boards and flexible cables. With reference to FIGS. 1-3, an interposer pad 10 is shown disposed between a first surface 11 and a second surface 12. The second surface 12 may be a contact or terminal on a printed circuit board or a portion of an electronic circuit. The first surface 11 is a metal or metal plating which is frequently formed of tin or a tin/lead alloy. The first surface 11 may be a similar contact or terminal but preferably is preferably formed on a compressible electrical connector 13.

The compressible electrical connector 13 comprises a thin flexible film wrapped around an elastomeric core, bonded thereto, and terminating in a "tail" 14. The thin flexible film has a plurality of circuit elements 15 or parallel microtraces photographically etched thereon, as for example, traces which are 1.5 mil wide and on 3.0 mil centers. The circuit elements 15 are formed as a layer of copper in contact with the flexible film. The layer of copper is in contact with a nickel layer and a thin outer layer of gold is in contact with the nickel layer. The elastomeric core, which may be of silicone rubber or other suitable material, has a substantially round cross-section although oval or other cross-sectional shapes may be used. Further details of the compressible electrical connector 13, being conventional, have been omitted for ease of illustration. The compressible electrical connector 13 is supplied under the trademark "AMPLIFLEX" owned by The Whitaker Corporation of Wilmington, Del., and licensed to AMP Incorporated of Harrisburg, Pa.

The compressible electrical connector 13 makes electrical contact with a third surface 16 which may be a flexible cable, printed circuit board or other segment of an electrical circuit. The third surface 16 is also a metal or metallic plating such as tin or gold.

A prior art electrical connection which includes the compressible electrical connector 13 without the interposer pad 10 suffers from a problem which will now be described. When an electrical connection is formed between the second surface 12 and the third surface 16, pressure is applied between the respective surfaces and the compressible electrical connector 13 is compressed wherein the circuit elements 15 contact the second surface 12 and the third surface 16. Due to the flexible nature of the circuit elements 15, said elements 15 conform to the contour of the respective second surface 12 and third surface 16 and serve as a first surface 11.

The second surface 12 is made of tin or a tin/lead alloy which becomes oxidized to form a coating which has reduced electrical transmission properties. As can be seen in prior art electrical connections, the oxidized coat becomes thicker with oxide balls caused by relative motion of the two surfaces, a non-compatible interface is produced between the tin oxide on the second surface 12 and the gold on the first surface 11. In the course of time, a satisfactory electrical contact is not made between the first surface 11 and the second surface 12 and the reliability of the electrical circuit, and of the equipment containing the circuit, deteriorates.

According to the invention, the interposer pad 10 disposed between the first surface 11 and the second surface 12 overcomes the oxidative effect and provides increased reliability to the electrical circuit and the equipment.

The interposer pad is a plastic layer 20 (preferably a polyamide polymer) having a plurality of electrically conducting particles 21 disposed in a random pattern throughout the plastic layer 20. The individual particles 21 extend between the first side 22 and the second side 23 of the plastic layer 20. The particles 21 preferably extend outwardly from the respective first side 22 and second side 23 of the plastic layer 20. The particles 21 are spaced apart from each other so that there is no lateral contact between any of the particles 21. In this manner, an anisotropic connection is formed between the first surface 11 and the second surface 12 wherein the circuit is conductive only in a direction oriented between the first side 22 and the second side 23 of the plastic layer 20.

The conducting particles 21 are preferably formed of a tin/lead alloy which is compatible with the metal of the second surface 12. In order to form a compatible electrical contact between the particles 21 in the pad 10 and the circuit elements 15, a solder connection is preferably made between the particles 21 and the traces of the circuit elements 15 which terminate in the tail 14 which extends from the compressible connector 13. Since gold to tin solder interfaces are excellent electrical connections and are not subject to the aforementioned problem of oxide coating, the electrical connection is reliable. Alternately, the particles 10 extending from the first side 22 of the interposer pad 21 may be directly soldered to the first surface 11 to effect a reliable electrical contact. When so soldered, the interposer pad 10 is secured to the first surface 11 but is separable from the second surface 12 (which may be the printed circuit board). If desired, and a non-separable junction is acceptable, the particles 21 extending from the second side 23 of the interposer pad 10 may be soldered to the second surface 12. In this manner, the interposer pad 21 is inseparably connected to both the first surface 11 and the second surface 12 and a reliable electrical contact with increased interconnection density is effected.

In either the separable or the inseparable configuration, the advantage is retained of the compressible electrical connector which provides a pliable contact which conforms to an irregular surface.

What is claimed is:

1. An electrical connection comprising:
   a compressible electrical connector including a plurality of spaced-apart, generally parallel microtraces of conductive material disposed on a compressible core member, the microtraces defining a first surface; and
   an anisotropic interposer pad including a plastic layer having a first side soldered to the first surface, a second side in contact with a second surface of the electrical connection, and a plurality of electrically conductive particles disposed in a random pattern generally throughout the plastic layer, each said particle extending between the first side and second sides of the plastic layer, there being no lateral contact between any of said particles, wherein the electrically conductive particles in the plastic layer are operative to conduct electricity in a direction oriented between the first and second sides of the plastic layer and to electrically connect the first surface to the second surface of the electrical connection through said interposer pad to thereby form a reliable electrical connection between the first and second surfaces.

2. The electrical connection of claim 1, wherein the second side of the plastic layer is soldered to the second surface of the electrical connection.

3. The electrical connection of claim 1, wherein the compressible electrical connector is compressibly disposed between the anisotropic interposer pad and a third surface of the electrical connection.

4. The electrical connection of claim 3, wherein a plurality of said compressible electrical connectors are compressibly disposed between said interposer and said third surface.

5. The electrical connection of claim 1, wherein the plastic layer is polyamide.

6. The electrical connection of claim 1, wherein the electrically conductive particles are formed from solder.

7. The electrical connection of claim 1, wherein the electrically conductive particles are formed from a tin/lead alloy.

* * * * *